US012761549B2

(12) United States Patent
Cone et al.

(10) Patent No.: US 12,761,549 B2
(45) Date of Patent: Oct. 13, 2026

(54) GENERATING WHOLE SUBSTRATE DROP PATTERNS WITH REPEATING EVALUATION REGIONS

(71) Applicant: CANON KABUSHIKI KAISHA, Tokyo (JP)

(72) Inventors: Craig William Cone, Austin, TX (US); Ahmed M. Hussein, Austin, TX (US); James W. Irving, Austin, TX (US); Ecron D. Thompson, Round Rock, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 412 days.

(21) Appl. No.: 18/147,261

(22) Filed: Dec. 28, 2022

(65) Prior Publication Data

US 2024/0219827 A1 Jul. 4, 2024

(51) Int. Cl.
*G03F 7/00* (2006.01)

(52) U.S. Cl.
CPC ........ *G03F 7/0002* (2013.01); *G03F 7/70516* (2013.01)

(58) Field of Classification Search
CPC ........................... G03F 7/0002; G03F 7/70516
See application file for complete search history.

(56) References Cited

U.S. PATENT DOCUMENTS

| | | | | |
|---|---|---|---|---|
| 8,586,126 | B2 | 11/2013 | Schumaker | |
| 2021/0132491 | A1* | 5/2021 | Thompson ............ | H01L 21/027 |
| 2022/0013417 | A1* | 1/2022 | Sreenivasan ........... | B41J 2/2054 |

* cited by examiner

*Primary Examiner* — Robert S Walters, Jr.
(74) *Attorney, Agent, or Firm* — Canon U.S.A., Inc. IP Division

(57) ABSTRACT

N whole substrate drop patterns are generated. Each of the N whole substrate drop pattern has M repeating drop patterns in repeating evaluation regions of a test substrate with predetermined dimensions and corresponding to a film to be formed from each of the N whole substrate drop patterns on test substrate. P statistical parameters of Q distributions of physical attributes of the M repeating drop patterns are calculated. The Q physical attributes are related to a thickness of a top layer of the film above substrate features. N figures of merit from the P statistical parameters corresponding to the N whole substrate drop patterns are determined. From the N whole substrate drop patterns, a satisfactory drop pattern that has a satisfactory figure of merit is selected among the N figures of merit. N, M, P, and Q are positive integers.

20 Claims, 8 Drawing Sheets

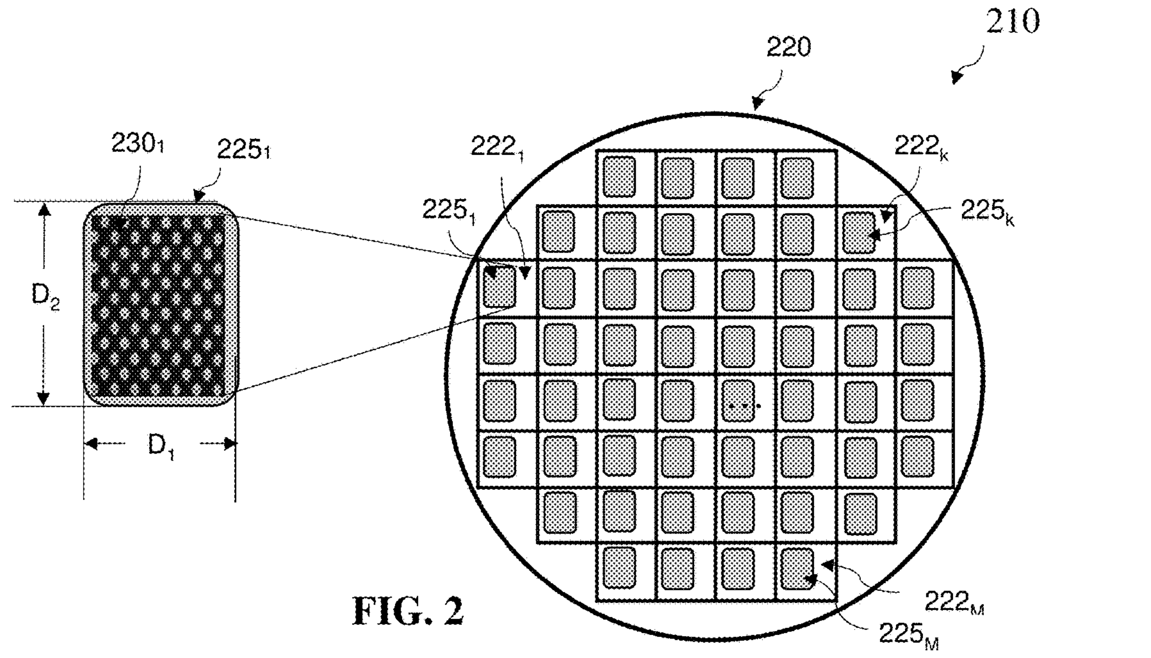
FIG. 2
FIG. 3
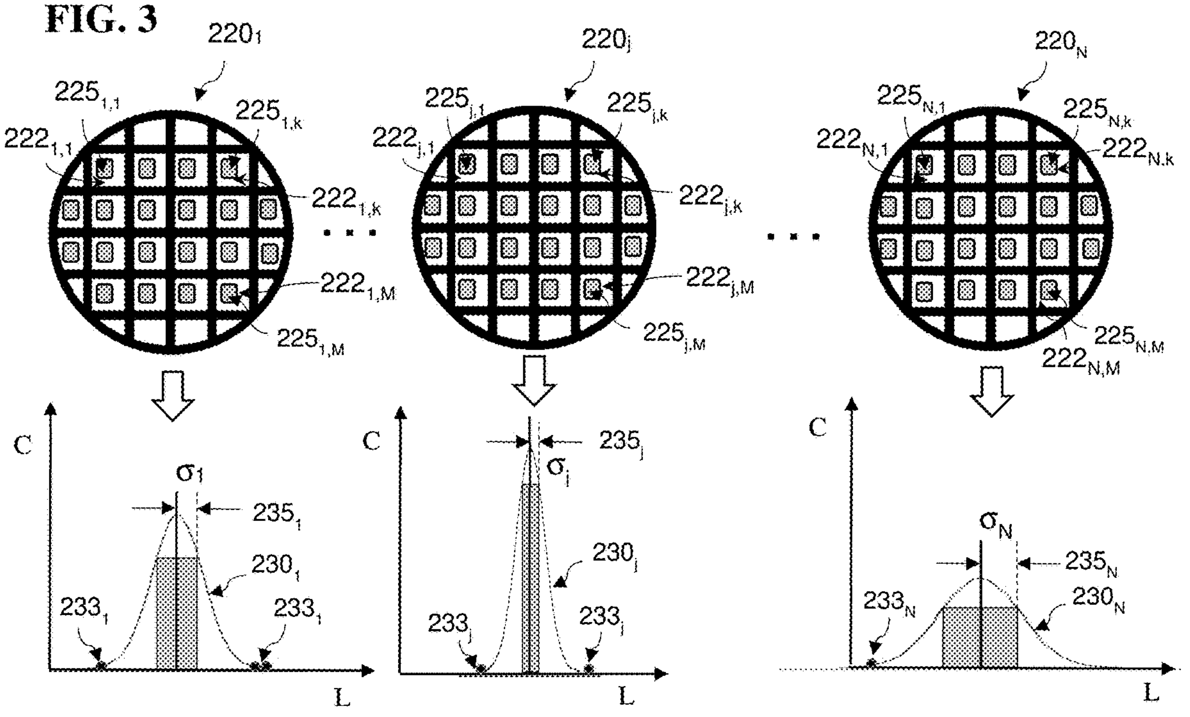

GENERATING WHOLE SUBSTRATE DROP PATTERNS WITH REPEATING EVALUATION REGIONS

BACKGROUND

Technical Field

One disclosed aspect of the embodiments relates to semiconductor fabrication applications. In particular, one disclosed aspect of the embodiments relates to techniques to generate whole drop patterns in nanolithography.

Description of the Related Art

Nanoimprint lithography (NL) has become an important technology in semiconductor manufacturing. NL offers many promising advantages over other technologies such as photolithography and extreme ultraviolet (EUV) lithography.

In a typical fabrication of semiconductor devices using NL, a fluid dispense system deposits a formable material such as a resist onto a substrate using a fluid droplet dispenser. The formable material is patterned into a patterned layer on the substrate by a template. This pattern is referred to as a drop pattern. Depending on the substrate topology and/or template design, the pattern of the drop pattern may vary.

One objective of generating drop patterns is to provide a drop pattern that results in uniform thickness of films of drops. However, determining a drop pattern that may produce a desirable level of uniformity of thickness is a complex process.

SUMMARY

One disclosed aspect of the embodiments includes a technique in nanolithography to generate N whole substrate drop patterns. Each of the N whole substrate drop pattern has M repeating drop patterns in repeating evaluation regions of a test substrate with predetermined dimensions and corresponding to a film to be formed from each of the N whole substrate drop patterns on test substrate. P statistical parameters of Q distributions of physical attributes of the M repeating drop patterns are calculated. The Q physical attributes are related to a thickness of a top layer of the film above the substrate features. N figures of merit from the P statistical parameters corresponding to the N whole substrate drop patterns are determined. From the N whole substrate drop patterns, a satisfactory drop pattern that has a satisfactory figure of merit is selected among the N figures of merit. N, M, P, and Q are positive integers.

Further features of the disclosure will become apparent from the following description of exemplary embodiments with reference to the attached drawings.

BRIEF DESCRIPTION OF THE DRAWINGS

FIG. 2 is a diagram illustrating a whole substrate drop pattern having repeating drop patterns in repeating evaluation regions.

FIG. 3 is a diagram illustrating whole substrate drop patterns and corresponding statistical distributions.

DESCRIPTION OF THE EMBODIMENTS

One disclosed aspect of the embodiments includes a technique in nanolithography to generate N whole substrate drop patterns. Each of the N whole substrate drop pattern has M repeating drop patterns in repeating evaluation regions of a test substrate with predetermined dimensions and corresponding to a film to be formed from each of the N whole substrate drop patterns on test substrate. P statistical parameters of Q distributions of physical attributes of the M repeating drop patterns are calculated. The Q physical attributes are related to a thickness of a top layer of the film above the substrate features. N figures of merit from the P statistical parameters corresponding to the N whole substrate drop patterns are determined. From the N whole substrate drop patterns, a satisfactory drop pattern that has a satisfactory figure of merit (FOM) is selected among the N figures of merit. N, M, P, and Q are positive integers.

Figure 1:
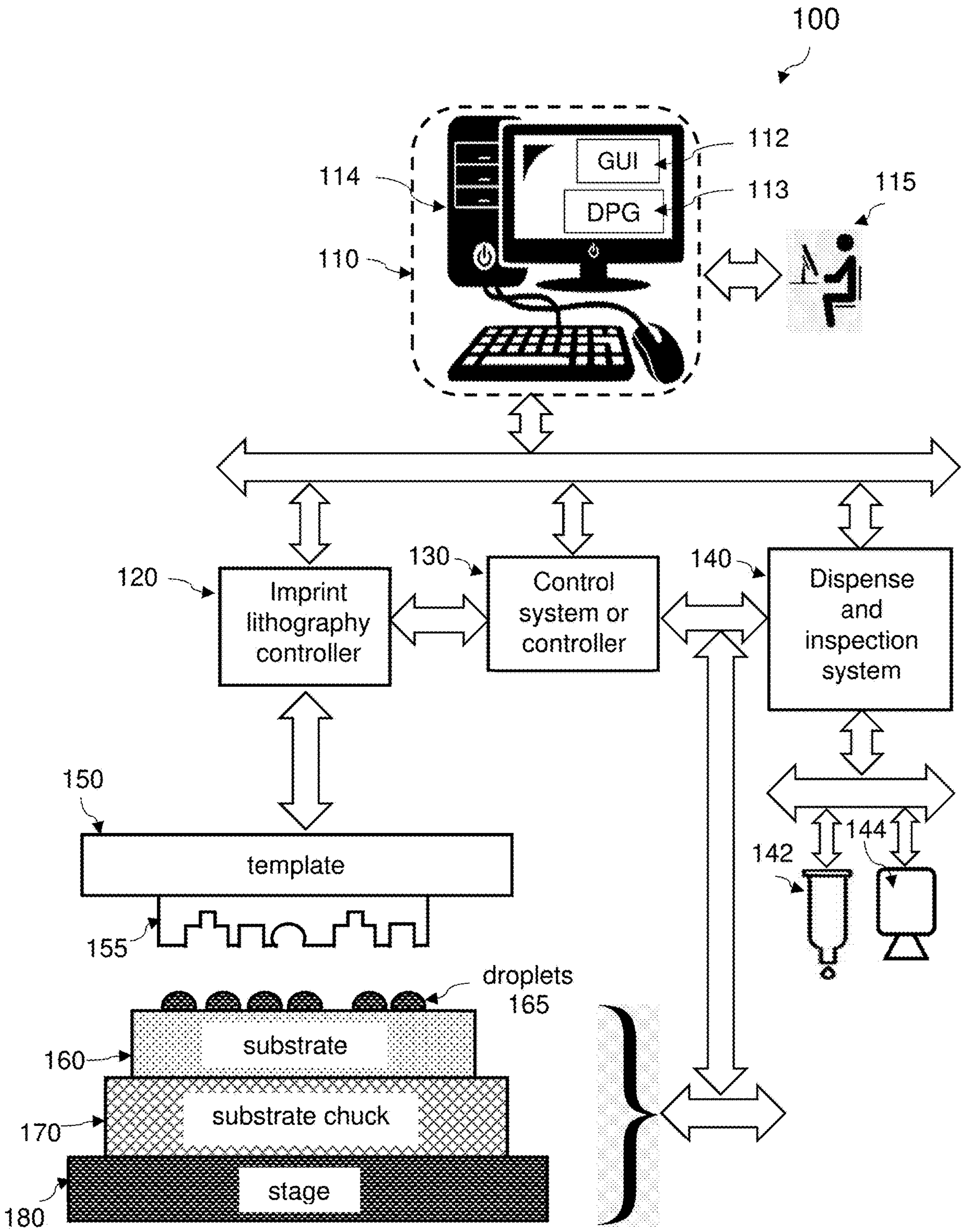
FIG. 1 is a diagram illustrating a system for nano-imprint lithography.

FIG. 1 is a diagram illustrating a system 100 for nano-imprint lithography. The system 100 includes a processing system 110, an imprint lithography controller 120, a control system or controller 130, and dispense and inspection system 140, a template 150 having a template pattern 155, a substrate 160, a substrate chuck 170, and a stage 180. The system 100 may include more or less than the above components. The system 100 is configured to generate drop patterns for use in lithography imprinting.

The processing system 110 provides processing and control functions for the lithography imprinting process. It includes a storage device 114 and a graphical user interface (GUI) 112. A user 115 interacts with the processing system to provides user commands to guide the process of generating the drop patterns. The storage device 114 may be any suitable non-volatile storage such as optical drive, hard disk drive, or solid-state drive. It typically stores a database that contains a drop pattern generation (DPG) process 113 for a template. The DPG 113 may be a processing package or module to generate whole substrate drop patterns having repeating evaluation regions as will be described in the following. This DPG 113 may be embodied in a non-transitory machine readable medium or an article of manufacturer.

The imprint lithography controller 120 controls the positioning and movement of the template 150. It may include an energy source and an imprint head (not shown) which helps in the movement of the template 150, and associated control circuits. It may also be controlled by the processing system 110 or the controller/control system 130.

The template 150 may be made from a material such as synthetic quartz, fused silica, silicon, organic polymers, or other suitable materials. The template pattern 155 includes features that have recesses and protrusions corresponding to the pattern to be formed on the substrate 160. In an embodiment, the template 150 does not have a pattern, is featureless and is used to form a planarized film on the substrate. The system 100 may then operate as a planarizing system and imprint lithography can be used for planarization. In an embodiment, the template 150 may be approximately the same size as the substrate or larger.

The substrate 160 may be coated with a thin adhesion layer to help in the adhesion of the resist to the substrate after the formable material is cured. It may be held by the substrate chuck 170 and both are positioned on the stage 180. The stage 180 may be controlled by the control system 130 to move the substrate and substrate chuck assembly.

The dispense and inspection system 140 is configured to dispense liquid resist into droplets 165 on the substrate 160. The processing system 110 or the controller or control system 130 provides user interface to a user and performs various control functions to other components in the system 100.

FIG. 2 is a diagram illustrating a whole substrate 210 having a substrate drop pattern 220.

The substrate 210 includes M dies 222 where k=1, M (from 1 to M) and M is a positive integer. Each die $\mathbf{222}_k$ includes a repeating evaluation region $\mathbf{225}_k$ which in turn includes a repeating drop pattern $\mathbf{230}_k$. The term "repeating" here refers to a characteristic that is similar across all dies in the substrate. The similar characteristic may include one or more of the predicted substrate topography, measured substrate topography, drop volume requirement, integrated circuit layout artwork, and the dimensions. The repeating evaluation region $\mathbf{225}_k$ may be one of a full region or a partial region. A full region is a region without intersection with a substrate edge exclusion zone. A partial region is a region which intersects with a substrate edge exclusion zone. An edge exclusion zone is a zone near the edges of the substrate where the drops are not allowed to occupy due to the increasing susceptibility to defects.

The repeating drop pattern $\mathbf{230}_k$ is a pattern of drops in each die $\mathbf{222}_k$ used in nano-lithography. The dimensions, the width $D_1$ and length $D_2$, of the repeating evaluation region 225 may be selected according to some performance criteria. The dimensions ($D_1$ and $D_2$) cannot exceed the dimensions of the die (or field). In an embodiment, the repeating evaluation region $\mathbf{222}_k$ is one of: a square; a rectangle; a polygon; a circle; an ellipse; polygon with rounded corners; or any shape that encloses a contiguous region. In an alternative embodiment, the repeating evaluation region $\mathbf{222}_k$ includes more than one contiguous region. The repeating evaluation region $\mathbf{222}_k$ should be smaller than a repeating field (die, pattern) and that the repeating evaluation region $\mathbf{222}_k$. In an embodiment a drop volume requirement of the repeating evaluation region $\mathbf{222}_k$ should be greater than a drop number threshold multiplied by an average drop volume. The drop number threshold is between 25-1000 and the average drop volume is between 0.8 pL and 10 pL. In an embodiment an area of repeating evaluation region $\mathbf{222}_k$ should have an area greater than 150 $\mu m^2$. In other words, to maintain repeatability, the repeating evaluation region $\mathbf{225}_k$ has to be within the die $\mathbf{222}_k$. In other words, the test substrate has repeating fields. Each field has the same desired topography and each repeating field has at least one evaluation region that is smaller than the field. In an alternative embodiment, each field may have multiple different evaluation regions.

Each repeating drop pattern $\mathbf{230}_k$ in each repeating evaluation region $\mathbf{225}_{j,k}$ has Q physical attributes each of which contributes to the uniformity of thickness of a top layer of the film residing above the topography of the substrate. Any non-uniformity of this top layer has a direct impact on the planarization of the substrate. In one embodiment, the Q physical attributes include at least one of drop density, volume, and estimated thickness. The estimated thickness is calculated based on subtracting the local drop requirement from the estimated drop volume supplied by the drop pattern. The substrate drop pattern 220 has M repeating drop patterns $\mathbf{230}_k$'s where k=1, . . . , M. These M drop patterns therefore can form a population of Q physical attributes for statistical evaluation. For example, suppose Q=1 and the physical attribute is the estimated thickness. By obtaining the distribution of the estimated thickness over the entire population of M drop patterns, we can calculate P statistical parameters such as mean, standard deviation, variance, number of outliers, kurtosis, range, mode, etc. which are useful in evaluating the uniformity of thickness of the whole substrate drop pattern 220 of the whole substrate 210.

Accordingly, to obtain the best whole substrate drop pattern 220 from a population of N whole substrate drop pattern $\mathbf{220}_j$'s where j=1, . . . , N, we can perform statistical evaluation on the Q physical attributes to obtain P statistical parameters. For each whole substrate drop pattern $\mathbf{220}_j$, we can determine a figure of merit (FOM) $F_j$ based on the P statistical parameters that represents the quality of uniformity of thickness of planarized film as the result of using the whole substrate drop pattern $\mathbf{220}_j$. A selection then can be performed on these $F_j$'s (j=1, . . . , N) to obtain the best whole substrate drop pattern or a set of satisfactory drop patterns based on a suitable selection criteria.

FIG. 3 is a diagram illustrating N whole substrate drop patterns $\mathbf{220}_j$'s and corresponding statistical distributions $\mathbf{230}_j$'s where j=1, . . . , N. For illustrative purposes, the distributions $\mathbf{230}_j$'s follow a Gaussian distribution with mean $\mu_j$'s and standard deviation $\sigma_j$'s. On the distribution curves $\mathbf{230}_j$'s, the samples $\mathbf{233}_j$'s refer the outliers which are those values abnormally far off the mean. The whole substrate drop pattern, the corresponding dies, repeating drop patterns, repeating evaluation region, physical attributes, and statistical parameters are similar to those described above in connection with FIG. 2. The main difference is the addition of the index j which refers to the index of the whole substrate drop pattern. Therefore, we will retain the same numerical label and only add the index j.

Each of the N whole substrate drop patterns $\mathbf{220}_j$'s corresponds to a whole substrate. Each substrate j includes M dies $\mathbf{222}_{j,k}$ where j=1, . . . , N and k=1, . . . , M, N and M are positive integers. Each die $\mathbf{222}_{j,k}$ includes a repeating evaluation region $\mathbf{225}_{j,k}$ which in turn includes a repeating drop pattern.

For each whole substrate drop pattern $\mathbf{220}_j$, there are M repeating drop patterns $\mathbf{220}_{j,k}$ where k=1, . . . , M. These M repeating drop patterns $\mathbf{220}_{j,k}$ provide P statistical parameters for Q physical attributes. We use the following notations:

$S_{ij}$=statistical parameter i of the physical attribute j.

For example, suppose there are three physical attributes j: 1=volume, 2=drop density, and 3=estimated thickness, and four statistical parameters i: 1=mean, 2=standard deviation, 3=population size, and 4=range. Therefore, $S_{12}$ is the mean of the drop density, $S_{33}$=population size of the estimated thickness, $S_{21}$=standard deviation of volume, $S_{23}$=standard deviation of estimated thickness, etc. All of these variables contribute to the uniformity of the thickness of the film. In an embodiment, the physical attributes may be calculated based on the whole substrate drop pattern $\mathbf{220}_j$.

Suppose Φ is a function of all of these variables. Φ returns a value called a figure of merit (FOM) representing the uniformity of the resulting planarized film thickness. We can write the following equation:

$$FOM=\Phi\{S_{ij}\}i=1,\ldots,P \text{ and } j=1,\ldots,Q \quad (1)$$

As an example, suppose Φ is a linear combination, * is the multiplication operator, / is the division operator Then:

$$FOM=\sum a_{ij}*S_{ij} \text{ for } i=1,\ldots,P \text{ and } j=1,\ldots,Q \quad (2)$$

As another example, Φ is a non-linear combination:

$$FOM=\alpha*S_{11}+\beta*S_{23}*S_{14}+\gamma*S_{34}/S_{21} \quad (3)$$

For illustration, FIG. 3 show $S_{23}$ the standard deviation statistical parameter of the estimated thickness. The distribution of the estimated thickness are 230$_1$, 230$_j$, and 230$_N$ for the whole substrate drop patterns 220$_1$, 220$_j$, and 220$_N$, respectively. The axes for the distribution curves are L, estimated thickness (horizontal axis) and C, or count (vertical axis). The corresponding statistical parameters are 235$_1$ ($\sigma_1$), 235$_j$ ($\sigma_j$), and 235$_N$ ($\sigma_N$). The distribution may follow any type of distributions such as Gaussian, Poisson, binomial except a delta function. If the distribution is a delta function then there was a problem with the drop pattern generation process or the repeating evaluation region 225$_k$ is too small.

Figure 4:
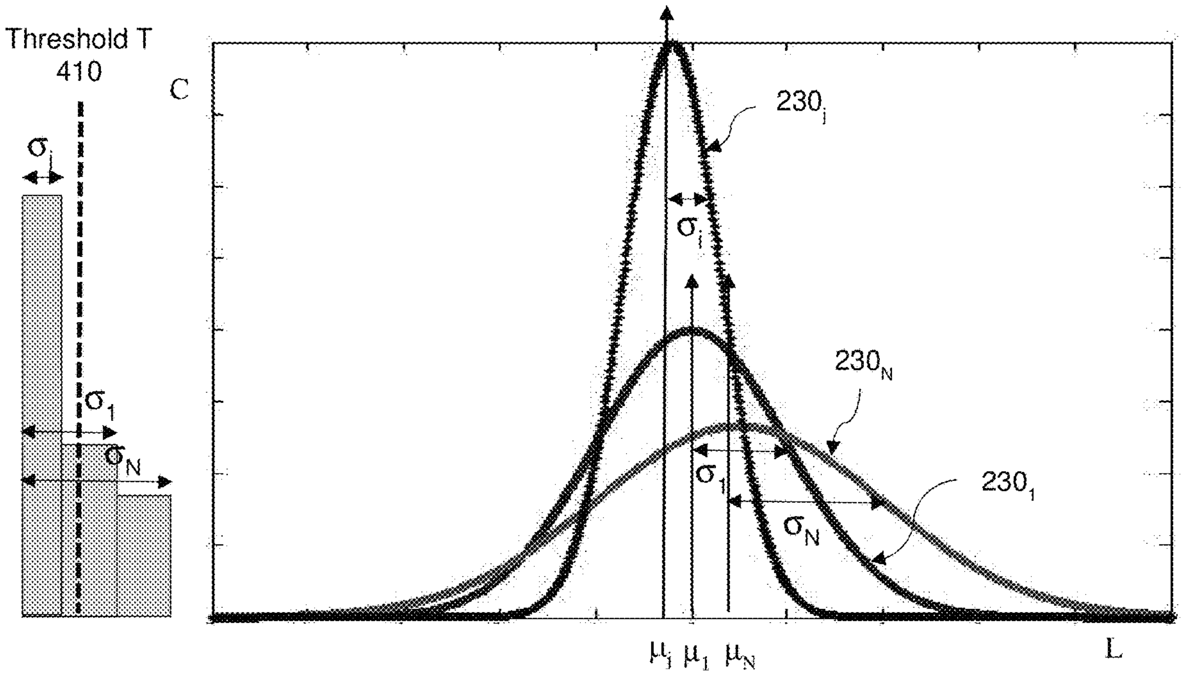
FIG. 4 is a diagram illustrating statistical distributions of a physical attribute of the repeating drop patterns.

FIG. 4 is a diagram illustrating statistical distributions of a physical attribute of the repeating drop patterns. For illustration, we assume the distribution follows a Gaussian or normal distribution.

To select the best whole substrate drop pattern, or those whole substrate drop patterns that are satisfactory for meeting a predetermined standard, we examine the figure of merit. Suppose the FOM is simply the single statistical parameter $S_{23}$. FIG. 4 shows these distributions are superimposed on each other for comparison.

There are at least two criteria for selecting a satisfactory whole substrate drop pattern, or a set of satisfactory whole substrate drop patterns. The first criteria is the use of thresholding. Any whole substrate drop pattern that has the FOM less than a threshold is considered satisfactory. For example, FIG. 4 shows the threshold T 410. The statistical parameter $\sigma_j$ having the index j is less than T and therefore is satisfactory. Accordingly, the whole substrate drop pattern 220; with the index j is selected as a satisfactory drop pattern and it will be used for fabricating articles. The statistical parameters $\sigma_1$ and $\sigma_N$ are greater than T and therefore are unsatisfactory and are not selected. The threshold may be fixed and determined in advance. It may also be variable or dynamic and changed according to a final thickness (above the substrate topography) of the evaluation regions. The second criteria is the optimum value. In other words, the best value of the FOM is selected.

Figure 5:
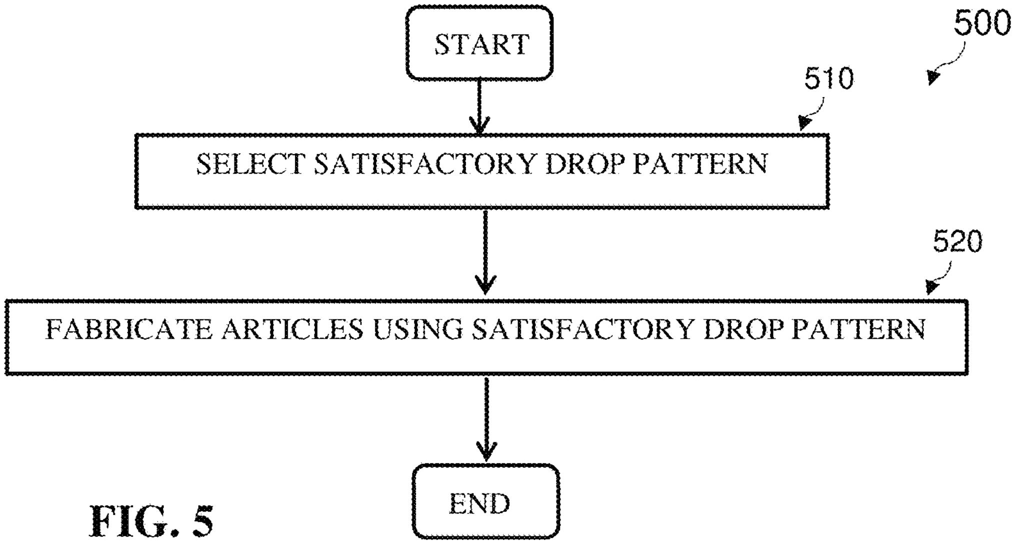
FIG. 5 is a diagram illustrating a process to select a satisfactory whole drop pattern and fabricate articles.

FIG. 5 is a diagram illustrating a process 500 to select a satisfactory whole drop pattern and fabricate articles.

Upon START, the process 500 selects or determines a satisfactory drop pattern (Block 510). This will be further explained in FIG. 6. Next, the process 500 fabricates a plurality of articles using the selected or determined satisfactory drop pattern from Block 510. The articles are the circuits which may be fabricated using known patterning techniques such as nano-imprint lithography and known planarization techniques for example inkjet adaptive planarization. The process 500 is then terminated.

Figure 6:
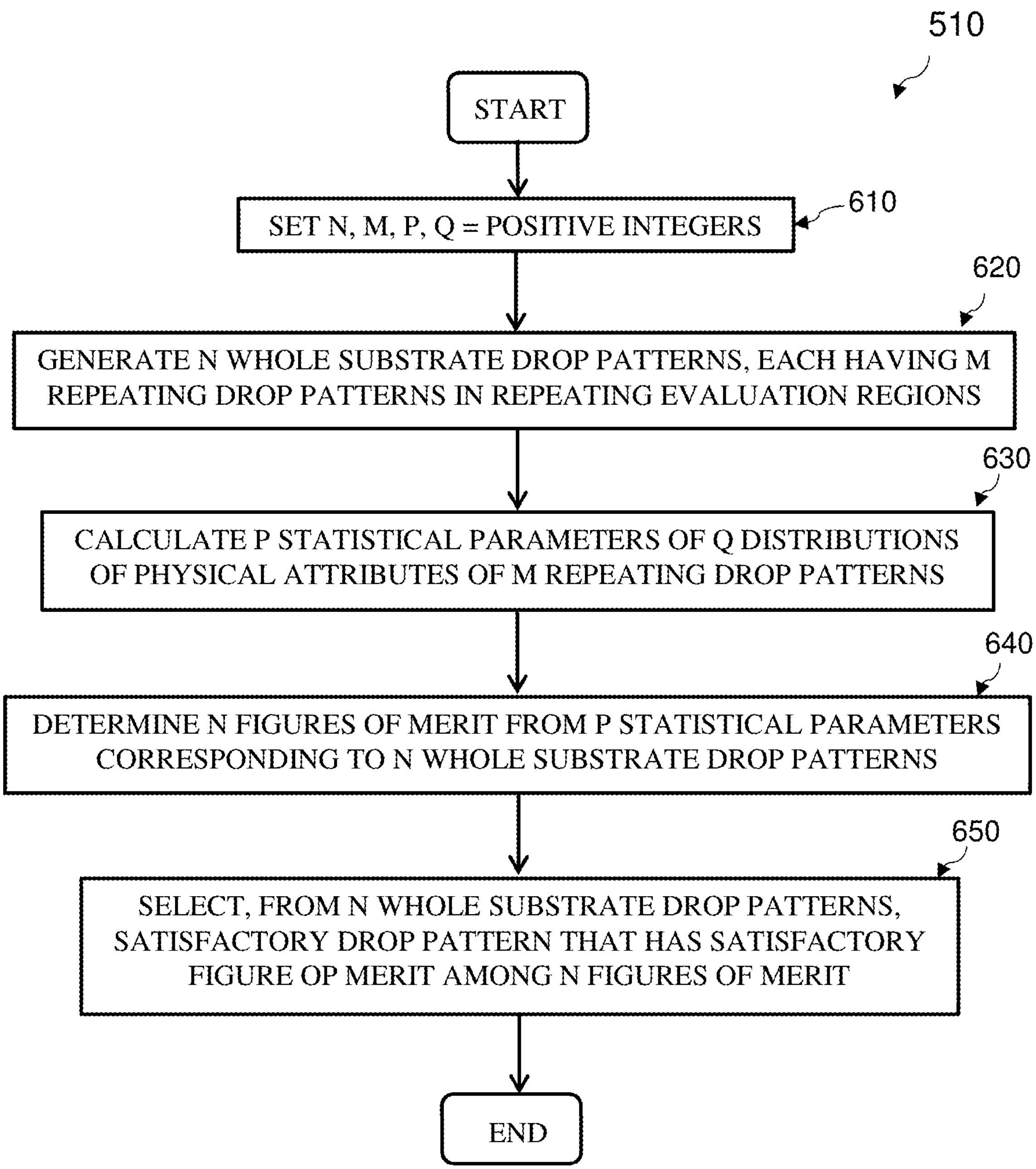
FIG. 6 is a diagram illustrating a process to select a satisfactory whole drop pattern.

FIG. 6 is a diagram illustrating the process 510 shown in FIG. 5 to select a satisfactory whole drop pattern. A satisfactory whole drop pattern is a pattern that results in a satisfactory level of uniformity of the thickness of a top layer of the planarized film. The top layer is above the features of the substrate.

Upon START, the process 510 sets N, M, P, and Q are known positive integers (Block 610). N is the number of test substrates or whole substrate drop patterns. M is the number of repeating drop patterns in each whole substrate drop pattern. P is the number of statistical parameters. Q is the number of physical attributes in the drop pattern.

Then, the process 510 generates N whole substrate drop patterns (Block 620). Each of the N whole substrate drop patterns has M repeating drop patterns in repeating evaluation regions of a test substrate with predetermined dimensions and corresponding to a film to be formed from each of the N whole substrate drop patterns on the test substrate. Next, the process 510 calculates P statistical parameters of Q distributions of physical attributes of the M repeating drop patterns (Block 630). The Q physical attributes are related to a thickness of a top layer of the film above the substrate topography.

Then, the process 510 determines N figures of merit (FOM) from the P statistical parameters corresponding to the N whole substrate drop patterns (Block 640). The FOM may be a function, linear or non-linear, that operates on the statistical parameters, and characterizes the uniformity of the film thickness. Next, the process 510 selects, from the N whole substrate drop patterns, a satisfactory drop pattern that has a satisfactory figure of merit among the N figures of merit (Block 650). In one embodiment, selecting the satisfactory drop pattern includes evaluating figures of merit of the plurality of evaluation regions against independent thresholds. The process 510 is then terminated.

Figure 7:
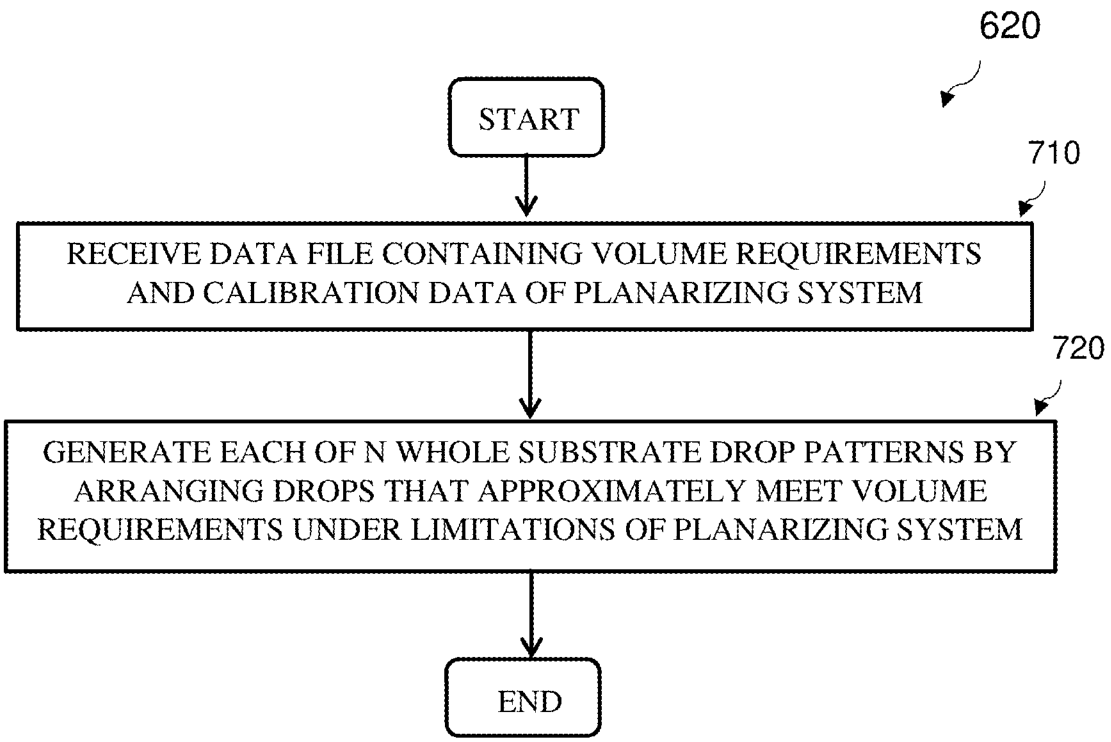
FIG. 7 is a diagram illustrating a process to generate whole substrate drop patterns.

FIG. 7 is a diagram illustrating the process 620 shown in FIG. 6 to generate whole substrate drop patterns.

Upon START, the process 620 receives a data file containing volume requirements of the test substrate and calibration data of a planarizing system used to form the film on the test substrate associated with the N whole substrate drop patterns (Block 710). In an embodiment, receiving a data file containing volume requirements may include receiving one or more data file (s) that include information that is used to calculate the volume requirements. For example, volume requirements may be represented by a 2D file and an etch depth which are then used to calculate the volume requirements. For example, volume requirements may be represented by multiple 2D files and multiple etch depths which are then used to calculate the volume requirements. The volume requirements may also be represented by one or more topography scans. The volume requirements may be represented by one or more predicted topographies based on design data (for example GDSII, OASIS, etc.). Next, the process 620 generates each of the N whole substrate drop patterns by arranging drops that approximately meet the volume requirements under limitations of the planarizing system (Block 720). The process 620 is then terminated.

Figure 8:
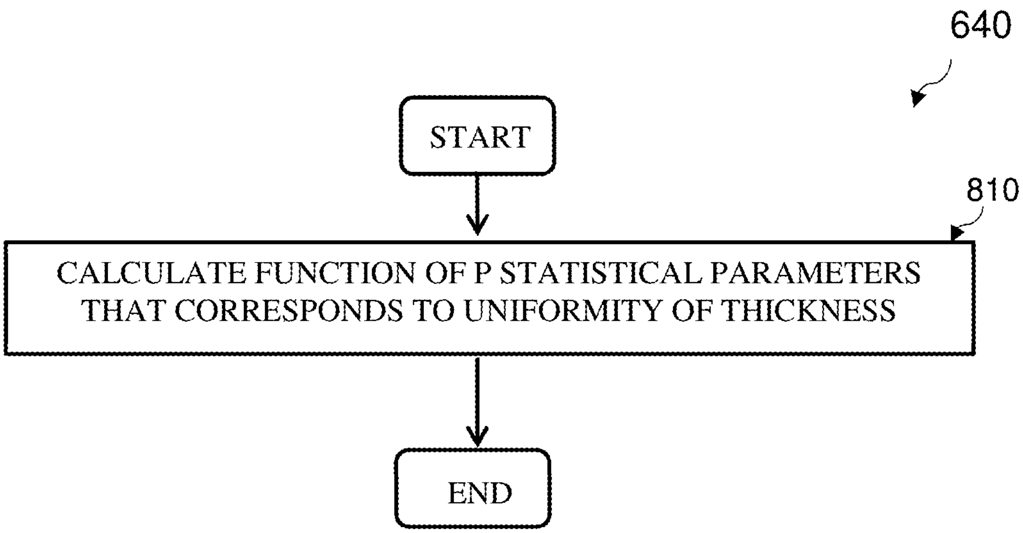
FIG. 8 is a diagram illustrating a process to determine figures of merit from statistical parameters.

FIG. 8 is a diagram illustrating the process 640 to determine figures of merit from statistical parameters.

Upon START, the process 640 calculates the function of the P statistical parameters that corresponds to a uniformity of the thickness (Block 810). In one embodiment, this function is the FOM of the form $\Phi\{S_{ij}\}$i=1, . . . , P and j=1, . . . , Q as shown in Equation (1). Then, the process 640 is terminated.

Figure 9:
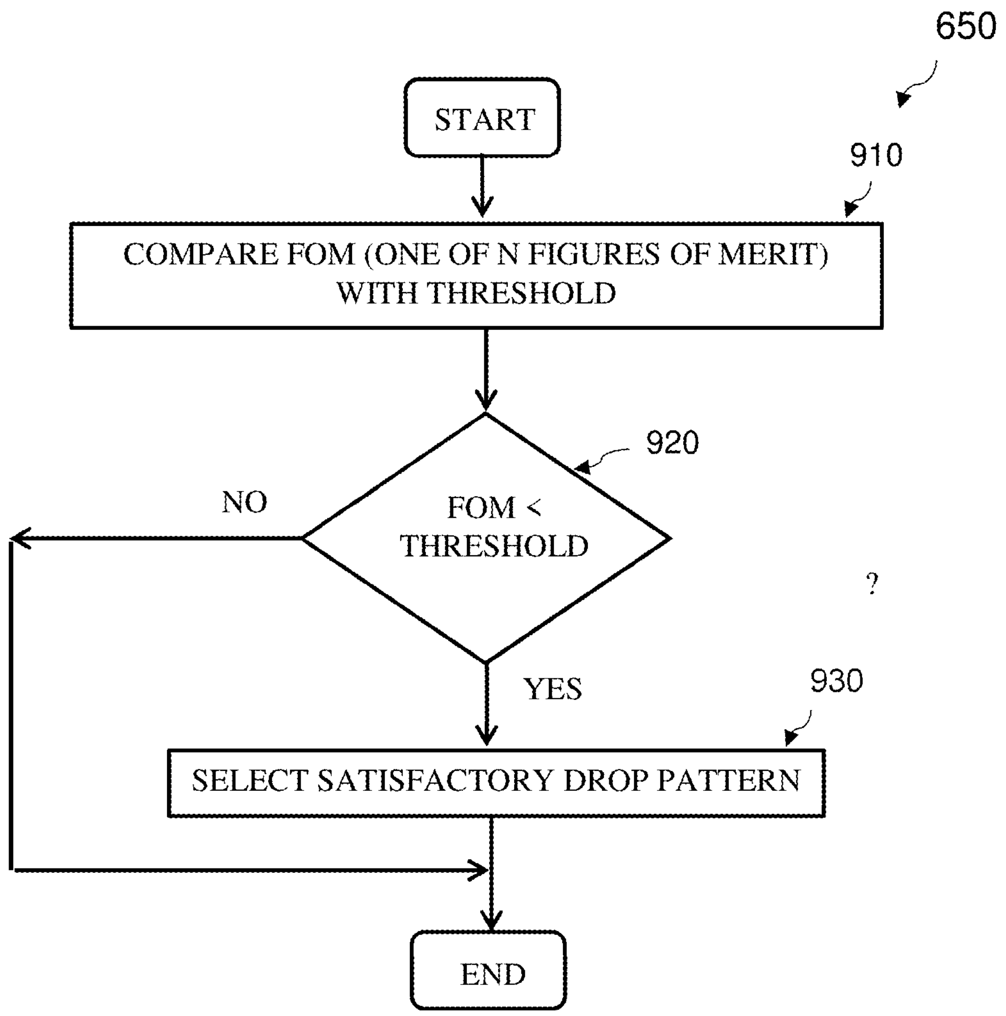
FIG. 9 is a diagram illustrating a process to select a satisfactory drop pattern using thresholding.

FIG. 9 is a diagram illustrating the process 650 to select a satisfactory drop pattern using thresholding. The thresholding uses a threshold value. This threshold value may be predetermined and fixed or variable. If it is fixed, it is predetermined based on a priori knowledge or as a result of calibration and/or testing. If it is variable, it is dynamically updated according to one or more subsequent steps that are applied to each of the evaluation regions. For example, it may be updated according to a final thickness of the evaluation regions.

Upon START, the process 650 compares one of the N figures of merit with a threshold to produce a comparison result (Block 910). Next, the process 650 determines if the calculated FOM is less than the threshold (Block 920). If so (YES), the process 650 selects the satisfactory drop pattern based on the comparison result using the index corresponding to the calculated FOM (Block 930) and is then terminated. Otherwise (NO), the process 650 is terminated and no satisfactory drop pattern is selected.

Figure 10:
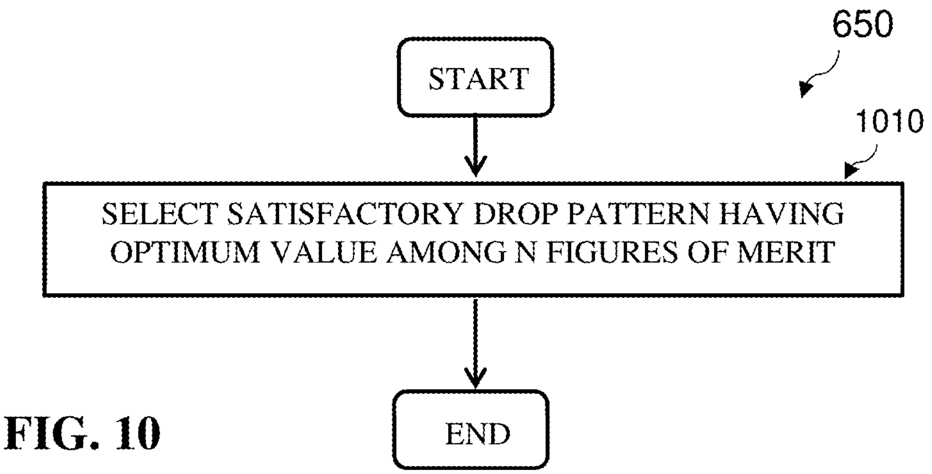
FIG. 10 is a diagram illustrating a process to select a satisfactory drop pattern using an optimum value.

FIG. 10 is a diagram illustrating the process 650 to select a satisfactory drop pattern using an optimum value.

Upon START, the process 650 selects the satisfactory drop pattern as the drop pattern that has an optimum value among the N figures of merit (Block 1010). Depending on the nature of the FOM, this optimum value may be the minimum value or the maximum value. For example, if the FOM corresponds to the uniformity of thickness, then it is desirable to have the least amount of variability and therefore the optimum value is the minimum value. The process 650 is then terminated.

Figure 11:
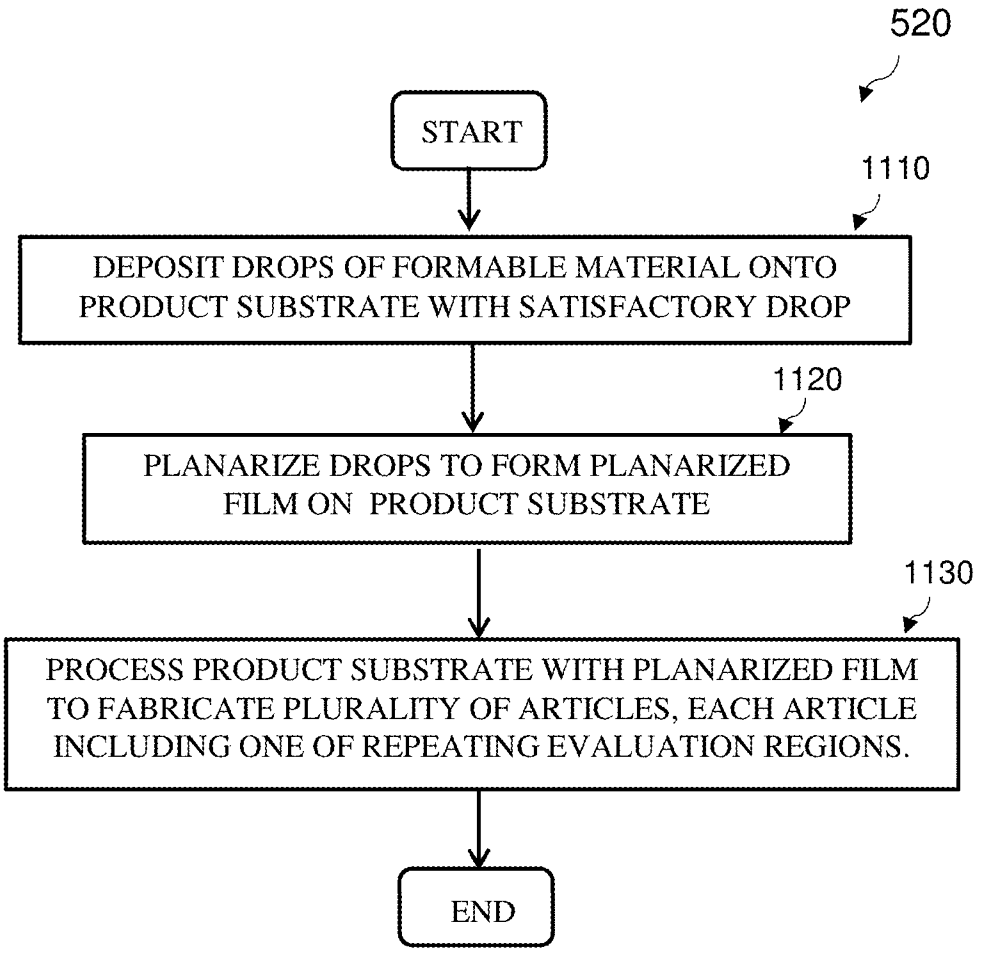
FIG. 11 is a diagram illustrating a process to fabricate articles using a selected satisfactory drop pattern.

FIG. 11 is a diagram illustrating the process 520 shown in FIG. 5 to fabricate articles using a selected satisfactory drop pattern. This process is the process to manufacture the integrated circuits from the product substrates (which may be semiconductor wafers). Accordingly, it is the normal process that is used for fabrication. Since this is the actual process that fabricates the circuits, it may be used as part of a testing process that provides feedback information to the generation of the whole substrate drop pattern. For example, the film thickness may be measured and the result may be used as part of an adaptive algorithm that updates the threshold value used in the thresholding operation in FIG. 9.

Upon START, the process 520 deposits drops of formable material onto a product substrate with the satisfactory drop pattern as determined or selected in block 510 (Block 1110). Next, the process 520 planarizes the drops to form a planarized film on the product substrate (Block 1120). Then, the process 520 processes the product substrate with the planarized film to fabricate a plurality of articles or dies (Block 1130). The planarized substrate can be further subjected to known steps and processes for device (article) fabrication, including, for example, coating, patterning, curing, oxidation, layer formation, deposition, doping, etching, formable material removal, dicing, bonding, and packaging, and the like. Each article or die includes one of the repeating evaluation regions. The process 520 is then terminated.

Figure 12:
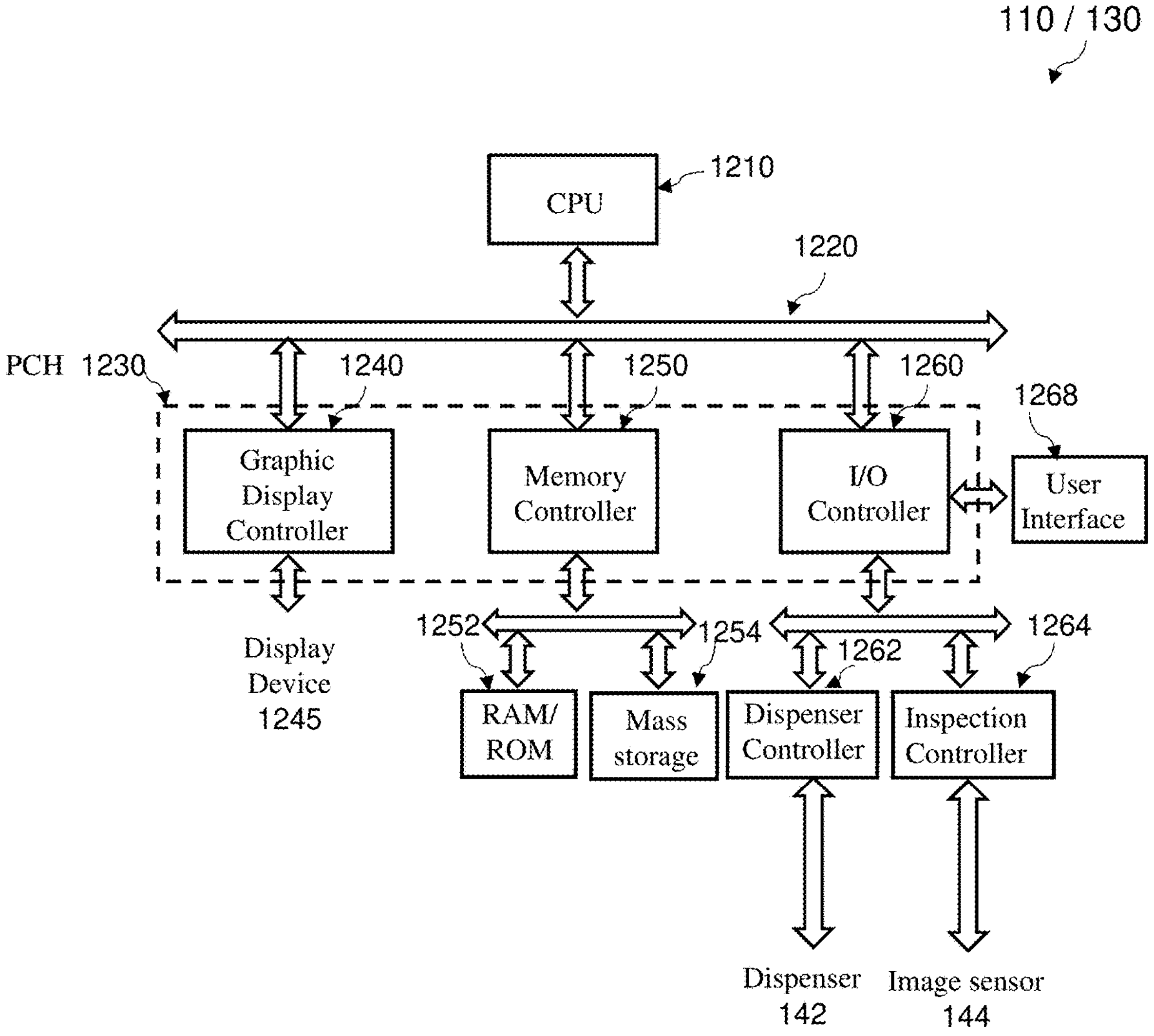
FIG. 12 is a diagram illustrating a processing system.

FIG. 12 is a diagram illustrating the processing system 110 or the control system 130 shown in FIG. 1.

The processing system 110 or the control system 130, referred to as the processing and/or control system 110/130, includes a central processing unit (CPU) or a processor 1210, a platform controller hub (PCH) 1230, and a bus 1220. The PCH 1230 may include a graphic display controller (GDC) 1240, a memory controller 1250, an input/output (I/O) controller 1260, and a mass storage controller 1254. The processing and control system 110/130 may include more or less than the above components. In addition, a component may be integrated into another component. As shown in FIG. 12, all the controllers 1240, 1250, and 1260 are integrated in the PCH 1230. The integration may be partial and/or overlapped. For example, the GDC 1240 may be integrated into the CPU 1210, the I/O controller 1260 and the memory controller 1250 may be integrated into one single controller, etc.

The CPU or processor 1210 is a programmable device that may execute a program or a collection of instructions to carry out a task. It may be a general-purpose processor, a digital signal processor, a microcontroller, or a specially designed processor such as one design from Applications Specific Integrated Circuit (ASIC). It may include a single core or multiple cores. Each core may have multi-way multi-threading. The CPU 1210 may have simultaneous multithreading feature to further exploit the parallelism due to multiple threads across the multiple cores. In addition, the CPU 1210 may have internal caches at multiple levels.

The bus 1220 may be any suitable bus connecting the CPU 1210 to other devices, including the PCH 1230. For example, the bus 1220 may be a Direct Media Interface (DMI).

The PCH 1230 in a highly integrated chipset that includes many functionalities to provide interface to several devices such as memory devices, input/output devices, storage devices, network devices, etc.

The I/O controller 1260 controls input devices (e.g., stylus, keyboard, and mouse, microphone, image sensor) and output devices (e.g., audio devices, speaker, scanner, printer). It also has interface to a user interface 1268 which provides interface to a user including specialized input/output devices and a network interface card which provides interface to a network and wireless controller (not shown).

The memory controller 1250 controls memory devices such as the random access memory (RAM) and/or the read-only memory (ROM) 1252, and other types of memory such as the cache memory and flash memory. The RAM 1252 may store instructions or programs, loaded from a mass storage device, that, when executed by the CPU 1210, cause the CPU 1210 to perform operations as described above. It may also store data used in the operations. The ROM 1252 may include instructions, programs, constants, or data that are maintained whether it is powered or not. The instructions or programs may correspond to the functionalities described above, such as the. drop patterns generator.

The GDC 1240 controls a display device 1245 and provides graphical operations. It may be integrated inside the CPU 1210. It typically has a graphical user interface (GUI) to allow interactions with a user who may send a command or activate a function. The GDC 1240 may display, on the display device, images of the color lights as collected from the sample in the human body.

The mass storage controller 1254 controls the mass storage devices such as flash memories, CD-ROM and hard disk. The mass storage device may store a database of the calibration data used in the generation of the whole substrate drop pattern.

The I/O controller 1260 may include a dispenser controller 1262 and an inspection controller 1264. The dispenser controller 1262 may include switching circuits, drive circuits, or trim voltage generators to generate control voltages or currents to the actuators in the dispensers 142. The inspection controller 1264 performs control functions related to the inspection station and the image sensor 144, such as start and stop capturing images, etc. The inspection controller 1264 may be used as part of a testing system that measures the uniformity of the thickness of the planarized film as done in the fabrication step. The measure information then can be used to update the parameters (e.g., threshold) in the generation of the drop patterns.

Additional devices or bus interfaces may be available for interconnections and/or expansion. Some examples may include the Peripheral Component Interconnect Express (PCIe) bus, the Universal Serial Bus (USB), etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules. In particular, the method described in the above may be embodied in a machine readable medium, or an article of manufacturer, which contains program instructions that, when executed by a processor, cause the processor to perform operations as described above.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A method comprising:

generating N whole substrate drop patterns for a test substrate, wherein each whole substrate drop pattern of the N whole substrate drop patterns has M repeating drop patterns in repeating evaluation regions of the test substrate with predetermined dimensions and corresponds to a film to be formed from drops that have been deposited on the test substrate, wherein each whole substrate drop pattern of the N whole substrate drop patterns is different from all other whole substrate drop patterns of the N whole substrate drop patterns, wherein M is two or more, and wherein the M repeating drop patterns are identical to each other;

calculating, for each of the N whole substrate drop patterns, respective statistical parameters of distributions of Q physical attributes of the M repeating drop patterns, wherein the Q physical attributes are related to a thickness of a top layer of the film above substrate features of the test substrate, wherein a respective distribution of the distributions is calculated for each physical attribute of the Q physical attributes, and wherein P respective statistical parameters of the statistical parameters are calculated for each distribution of the distributions;

determining N figures of merit, wherein each of the N figures of merit is determined for a respective whole substrate drop pattern of the N whole substrate drop patterns based on the respective statistical parameters of the respective whole substrate drop pattern;

selecting, from the N whole substrate drop patterns, a satisfactory whole substrate drop pattern that has a satisfactory figure of merit among the N figures of merit;

depositing drops of formable material onto a product substrate according to the satisfactory whole substrate drop pattern; and planarizing the drops to form a planarized film on the product substrate, wherein N, M, P, and Q are positive integers, and wherein N is two or more.

2. The method according to claim 1, wherein generating the N whole substrate drop patterns comprises receiving a data file containing volume requirements of the test substrate and calibration data of a planarizing system used to form the film on the test substrate associated with the N whole substrate drop patterns, and wherein generating each of the N whole substrate drop patterns comprises arranging drops that approximately meet the volume requirements under limitations of the planarizing system.

3. The method according to claim 1, wherein the P respective statistical parameters include at least one of standard deviation, variance, number of outliers, kurtosis, range, and mode.

4. The method according to claim 1, wherein the Q physical attributes include at least one of drop density, volume, and estimated thickness.

5. The method according to claim 1, wherein determining the N figures of merit comprises:

calculating a function of the P respective statistical parameters that corresponds to a uniformity of the thickness.

6. The method according to claim 1, wherein each of the repeating evaluation regions is a full region or a partial region.

7. The method according to claim 6, wherein the partial region intersects with a substrate edge exclusion zone.

8. The method according to claim 1, wherein selecting the satisfactory whole substrate drop pattern comprises:

comparing one of the N figures of merit with a threshold to produce a comparison result; and selecting the satisfactory whole substrate drop pattern based on the comparison result.

9. The method according to claim 8, wherein the threshold is fixed or variable.

10. The method according to claim 9, wherein the threshold is variable according to a final thickness of the repeating evaluation regions.

11. The method according to claim 9, wherein the threshold is variable according to one or more subsequent steps that are applied to each of the repeating evaluation regions.

12. The method according to claim 1, wherein selecting the satisfactory whole substrate drop pattern comprises:

selecting the satisfactory whole substrate drop pattern having an optimum value among the N figures of merit.

13. The method according to claim 1, further comprising: processing the product substrate with the planarized film to fabricate a plurality of articles.

14. The method according to claim 1, wherein the test substrate has repeating fields, each field having an identical desired topography, wherein each field has one respective evaluation region, of the repeating evaluation regions, and wherein the one respective evaluation region is smaller than the field.

15. The method according to claim 14, wherein each field has a plurality of evaluation regions, of the repeating evaluation regions;

wherein determining N figures of merit includes determining N figures of merit for each of the plurality of evaluation regions of each field; and wherein selecting the satisfactory whole substrate drop pattern includes evaluating the N figures of merit of the plurality of evaluation regions against independent thresholds.

16. The method according to claim 1, wherein each whole substrate drop pattern of the N whole substrate drop patterns has a respective drop volume, and wherein the planarized film can be formed from the respective drop volume of each whole substrate drop pattern of the N whole substrate drop patterns.

17. The method according to claim 1, wherein M is ten or more.

18. The method according to claim 17, wherein P is two or more, and wherein Q is two or more.

19. The method according to claim 1, wherein the repeating evaluation regions are identical to each other.

20. The method according to claim 1, wherein the M repeating drop patterns do not overlap each other.

* * * * *